US007513332B2

(12) United States Patent
Moore

(10) Patent No.: US 7,513,332 B2
(45) Date of Patent: Apr. 7, 2009

(54) CONVERTIBLE FOLDED HORN ENCLOSURE WITH IMPROVED COMPACTNESS

(76) Inventor: Dana A. Moore, 25 -157 th Pl. SE., Bothell, WA (US) 98012

( * ) Notice: Subject to any disclaimer, the term of this patent is extended or adjusted under 35 U.S.C. 154(b) by 34 days.

(21) Appl. No.: 11/900,534

(22) Filed: Sep. 12, 2007

(65) Prior Publication Data

US 2009/0065293 A1 Mar. 12, 2009

(51) Int. Cl.

| | |
|---|---|
| ***G10K 11/02*** | (2006.01) |
| ***G10K 11/20*** | (2006.01) |
| ***H04R 1/22*** | (2006.01) |
| ***H04R 1/30*** | (2006.01) |
| *H05K 5/02* | (2006.01) |
| *H04R 1/20* | (2006.01) |

(52) U.S. Cl. ....................... 181/155; 181/156; 181/152; 181/192; 381/341; 381/352

(58) Field of Classification Search ................ 181/199, 181/156, 177, 152, 148, 155, 194, 192, 187, 181/188; 381/341, 352, 160, 349, 338, 340, 381/345, 337, 339, 342

See application file for complete search history.

(56) References Cited

U.S. PATENT DOCUMENTS

| | | | | |
|---|---|---|---|---|
| 1,843,524 | A * | 2/1932 | Stenger | 181/159 |
| 2,310,243 | A * | 2/1943 | Klipsch | 181/152 |
| 2,373,692 | A * | 4/1945 | Klipsch | 181/152 |
| 2,491,982 | A * | 12/1949 | Kincart | 181/156 |
| 2,558,278 | A * | 6/1951 | Stone et al. | 181/194 |
| 2,646,851 | A * | 7/1953 | Chapman et al. | 181/155 |
| 2,746,558 | A * | 5/1956 | Levy | 181/194 |
| 2,815,086 | A * | 12/1957 | Hartsfield | 428/102 |
| 2,858,899 | A * | 11/1958 | Lopez-Henriquez | 181/155 |
| 3,032,137 | A * | 5/1962 | Rice | 181/199 |
| 3,912,866 | A * | 10/1975 | Fox | 381/352 |
| 4,014,597 | A * | 3/1977 | Griffin, Jr. | 312/7.1 |
| 4,173,266 | A * | 11/1979 | Pizer et al. | 181/156 |
| 4,210,223 | A * | 7/1980 | Gillum et al. | 181/152 |
| 4,286,688 | A * | 9/1981 | O'Malley | 181/156 |
| 4,356,881 | A * | 11/1982 | Lowell | 181/150 |
| 4,509,192 | A * | 4/1985 | Straughn | 381/348 |
| 4,860,367 | A * | 8/1989 | Hook | 381/341 |
| 5,189,706 | A * | 2/1993 | Saeki | 381/349 |
| 5,266,752 | A * | 11/1993 | Cussans | 181/155 |
| 5,321,388 | A * | 6/1994 | Biersach | 340/404.1 |
| 5,327,985 | A * | 7/1994 | Porzilli | 181/177 |
| 5,359,158 | A * | 10/1994 | Queen | 181/150 |
| 5,468,922 | A * | 11/1995 | Hanba | 181/150 |
| 5,525,767 | A * | 6/1996 | Fields | 181/155 |
| 5,637,840 | A * | 6/1997 | Kim | 181/152 |
| 5,804,774 | A * | 9/1998 | Ford et al. | 181/152 |
| 5,825,900 | A * | 10/1998 | Jeon | 381/339 |
| 6,144,751 | A * | 11/2000 | Velandia | 381/345 |
| 6,634,455 | B1 * | 10/2003 | Yang | 181/156 |
| 7,233,677 | B2 * | 6/2007 | Moore | 381/341 |
| 7,252,176 | B2 * | 8/2007 | Moore | 181/199 |
| 7,436,972 | B2 * | 10/2008 | Bouvier | 381/345 |
| 2008/0099273 | A1 * | 5/2008 | Moore | 181/156 |
| 2008/0110692 | A1 * | 5/2008 | Moore | 181/156 |

* cited by examiner

*Primary Examiner*—Edgardo San Martin

(57) ABSTRACT

A low frequency exponential bass horn enclosure employing a bifurcated horn pathway and twin throats, convertible to a variety of front-loaded or rear-loaded configurations without modifications by the use of interchangeable parts, with driver access typically from the front. Optimized for corner placement but fully enclosed horn channel allows for floor or wall use. The horizontal "butterfly" throat is located at the rear of the enclosure and expands vertically, and the vertically arranged horn terminus exhausts in forward-canted splay angles around a partially rectangular back chamber.

10 Claims, 6 Drawing Sheets

CONVERTIBLE FOLDED HORN ENCLOSURE WITH IMPROVED COMPACTNESS

BACKGROUND OF THE INVENTION

The present invention relates to loudspeaker enclosures of the low frequency exponential folded horn type. More specifically, it relates to horn enclosures that are optimized for use in an environment corner.

The current invention relates directly to my previous U.S. patent application Ser. No. 11/595,204 titled "Convertible Folded Horn Enclosure" and can be considered a contribution over my previous invention with regard to improved compactness, increased versatility, and providing an improvement by comparatively reducing construction costs without the undue sacrifice of the performance, and further improving the utility and configuration capabilities disclosed in the referenced prior art disclosure. The differences disclosed herein will establish the current invention as being critically distinct in composition and form, with advantages being increased over the cited prior art.

The cited prior art disclosure teaches that a large-throated folded horn using multiple flare rates terminating with an appropriately sized mouth for its planned position of operation can provide an extremely wide operational band pass with an extremely short overall horn pathway when the driver(s) are accurately annulled. A device such as disclosed in the prior art negates the necessity of horn pathway length as being an overriding determiner of frequency response smoothness or uniformity of amplitude, and that the determination of the upper frequency corner is removed from being a limiting property of the horn itself to instead being determined by the properties of the driver(s) employed. It is a long established principle in the art that a horn device having multiple flare rates does not exhibit the upper frequency corner limitation typical of single flare rate horns and that the frequency response of such a device is rendered more competitive in bandwidth and overall response uniformity compared to longer pathway horns in that the number of folds are typically reduced per given enclosure volume. The cited prior art disclosure teaches that extremely short pathway horns, the result of a relatively large throat area, and utilizing multiple flare rates, do not tend to suffer from impedance mismatches as do short single-flare rate horns of the same overall lower frequency cutoff (Fc) or flare rate, and that the main consideration in such a device is one of effective impedance matching, not horn pathway length.

It is in keeping with the teachings of the cited prior art, without such disclosure, the efficacy and the desirability of the current invention would be questionable by the generally accepted principles applied to folded horns; that the current invention embodies a shorter overall pathway length than even the prior art device, producing the benefits of reducing material requirements, complexity, and labor, the resulting smaller footprint and lighter weight compared to the prior art apparatus providing a higher degree of desirability between the two.

The current invention is comparatively more economical to build, incorporates a smaller footprint and lighter weight while increasing the available configuration capabilities afforded by the previously cited prior art apparatus without detriment to the overall frequency response, bandwidth, efficiency, and versatility heretofore obtained in the prior art.

SUMMARY OF THE INVENTION

It is an object of the present invention to provide at least the same levels of performance, including frequency response, overall bandwidth, and efficiency as in the previously cited invention while increasing the ease of construction.

An additional object of the present invention is to provide a reduced footprint size, when compared to the previously cited prior art example. This feature increases portability by reducing weight, and results in further construction cost savings.

It is a further object of the present invention to provide an increased ability to optionally employ different driver/application configurations, including those which the cited prior art apparatus is less capable of successfully employing, such as push-pull, compound horn, and/or mixed driver and phase-inversion configurations compared to the previously cited prior art example by increasing the available contiguous back chamber space.

The present invention horn mouth area is consistent with the previous invention as approximately 800 square inches in area. The frequency response and efficiency rating also remains relatively consistent with the previous invention. The footprint dimensions are consistent with the cited prior art in width and height, however, the overall depth of the invention is substantially reduced compared to the previously cited prior art.

The current invention provides an increase in contiguous back chamber space compared to the previously cited prior art, in a smaller footprint, allowing for additional driver configurations to be employed in addition to those disclosed in the cited prior art document. Additionally, the current invention allows optional access from the top and bottom of the enclosure as desired due to the increase in contiguous back chamber volume, although with a consequence of less utility. This optional configuration was not practical on the prior art device.

The nominal Fc of approximately 38 Hz horn remains the same as the previous invention, as does the overall horn mouth cross-section. The major difference in the current invention from the cited example is that a flat panel is used at the rear of the enclosure, perpendicular to the throat opening, forming the rearward part of the throat channel, and the throat opening is located at the rear of the enclosure, the baffle board containing the throat opening forms the forward part of the throat channel, and is horizontally bifurcated at that point, in contrast with the previous example, which employs an axially-oriented throat channel of a unitary nature which is subsequently bifurcated at the rear of the enclosure.

The throat expansion of approximately 60 Hz flare rate is achieved through the use of vertically expanding baffles and the parallel rear and baffle panel provide a consistent horizontal channel depth to the throat channel pathway. The baffles are arranged to exclusively expand vertically in the throat section. The throat opening width is not limited as in the cited prior art device. The terminal horn section additionally expands horizontally. The flat back panel and the attendant throat channel expansion proportions and the addition of vertical side channel baffles with the attendant increase in available back chamber contiguous linear length constitute the main difference between the current invention and the previously cited invention. The throat baffle arrangement of the current invention utilizes a single flat enclosure back panel which is comparatively easier to manufacture and construct than the previously cited prior art throat assembly which utilizes a unitary throat pathway and a more-forward placed baffle board, respectively.

DESCRIPTION OF THE INVENTION

Figure 1:
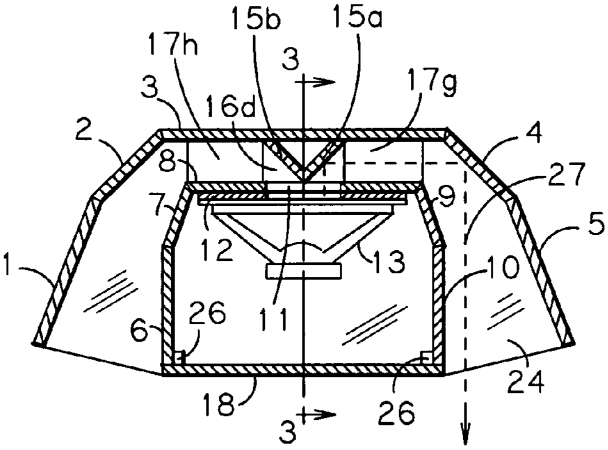
FIG. 1 is a sectional view of the invention from line 1-1 of FIG. 2.
Figure 4:
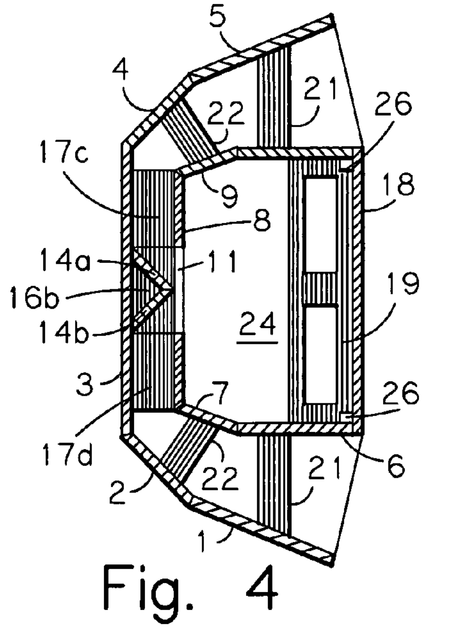
FIG. 4 is a sectional view from line 4-4 of FIG. 3 excluding the lower driver and mounting board for clarity.

The current invention consists of a folded exponential horn enclosure which is symmetrical in both horizontal and vertical planes which consists of a substantially rectangular shaped centrally arranged back chamber that is contained within an outer-wall enclosure shell as formed by the rear-channel walls, the outer walls in combination with the back chamber side walls forming a predominately vertical horn channel exit exhausting in a mostly-forward direction around both sides of the back chamber. The entire back chamber volume may optionally be accessed from the front by use of a removable front panel 18 seen in the drawings.

The overall mouth size for an ⅛ space horn (as measured at the terminal exit) required for the given Fc of 38 Hz is approximately 800 square inches in area (where further waveform expansion presumably takes place outside of the enclosure, as is typical of the genre and is well known in the art), and therefore, the invention in its optimal state is approximately 39 inches in height, which is also determined to present the optimum height for the effective propagation of a top-mounted midrange and/or high frequency horns to a seated audience. It can be seen that the horn terminus, while technically undersized, does not constitute a foreshortened horn when the invention is properly placed in a corner, that being the mouth size forms an effective match to the acoustic impedance incurred with ⅛ space placement.

The preferred embodiment of the invention can be seen in FIGS. 1-5. The preferred embodiment of the invention employs two 15-inch drivers, the combination providing a relatively large combined throat area. The invention is capable of being constructed as single full-height unit or being equally divided in the horizontal plane forming separate half-height enclosures each employing a single 15-inch driver 13, which are intended to be stacked when in operation, and thereby achieving the optimum overall mouth size. In the present disclosure, the dual-driver single unit version is referred to as the preferred embodiment, and the half-height versions as the alternative half-height embodiments. Certain configuration capabilities which the current invention supports and which the cited prior art does not readily support are included in the drawings in FIGS. 10 through 14, which constitutes an increase in utility and advantage compared to the previously cited prior art apparatus.

Figure 6:
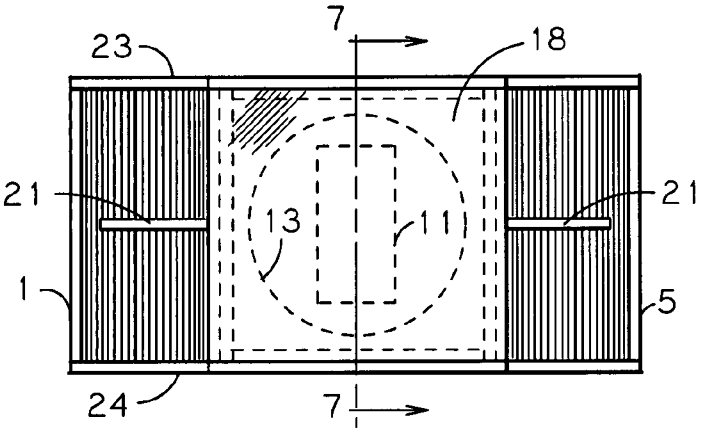
FIG. 6 is a front elevation view of the alternative half-height embodiment.
Figure 7:
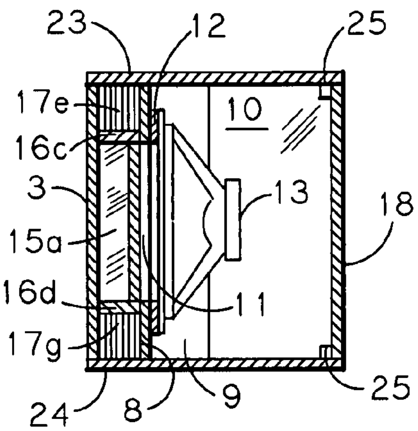
FIG. 7 is a sectional view from line 7-7 of FIG. 6 of the alternative half-height embodiment.
Figure 8:
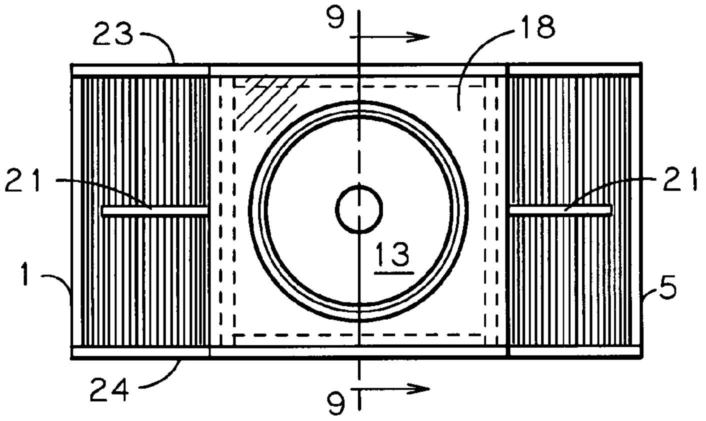
FIG. 8 is a front elevation view of the alternative half-height embodiment in rear-loaded configuration.
Figure 9:
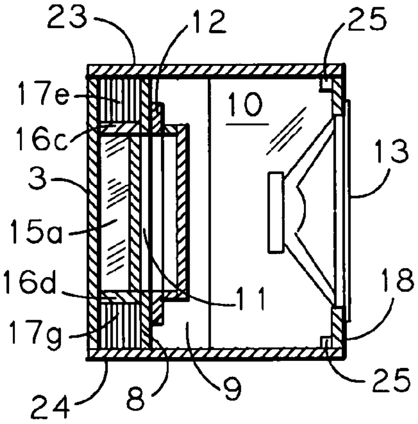
FIG. 9 is a sectional view from line 9-9 of FIG. 8 of the alternative half-height embodiment in rear-loaded configuration.

The half-height embodiments seen in FIGS. 6 though 9 are considered a desirable modification of the current invention specifically for use in public address applications for reasons of easier portability. The full-height embodiment is considered desirable in the case of domestic use where appearance is presumably more important. In the present disclosure, it can be assumed that the same elements in both the full and half-height embodiments are functionally equivalent when present in the half-height embodiments. The current invention is disclosed in the drawings as being constructed of ¾ inch thick panels. FIGS. 6 and 7 disclose a half-height front-loaded configuration, and FIGS. 8 and 9 disclose a half-height rear-loaded configuration achieved by the modification of the front panel 18 and an alternative driver mounting board 12 seen in FIG. 9 to restrict the upper frequency band pass of the current invention.

Figure 5:
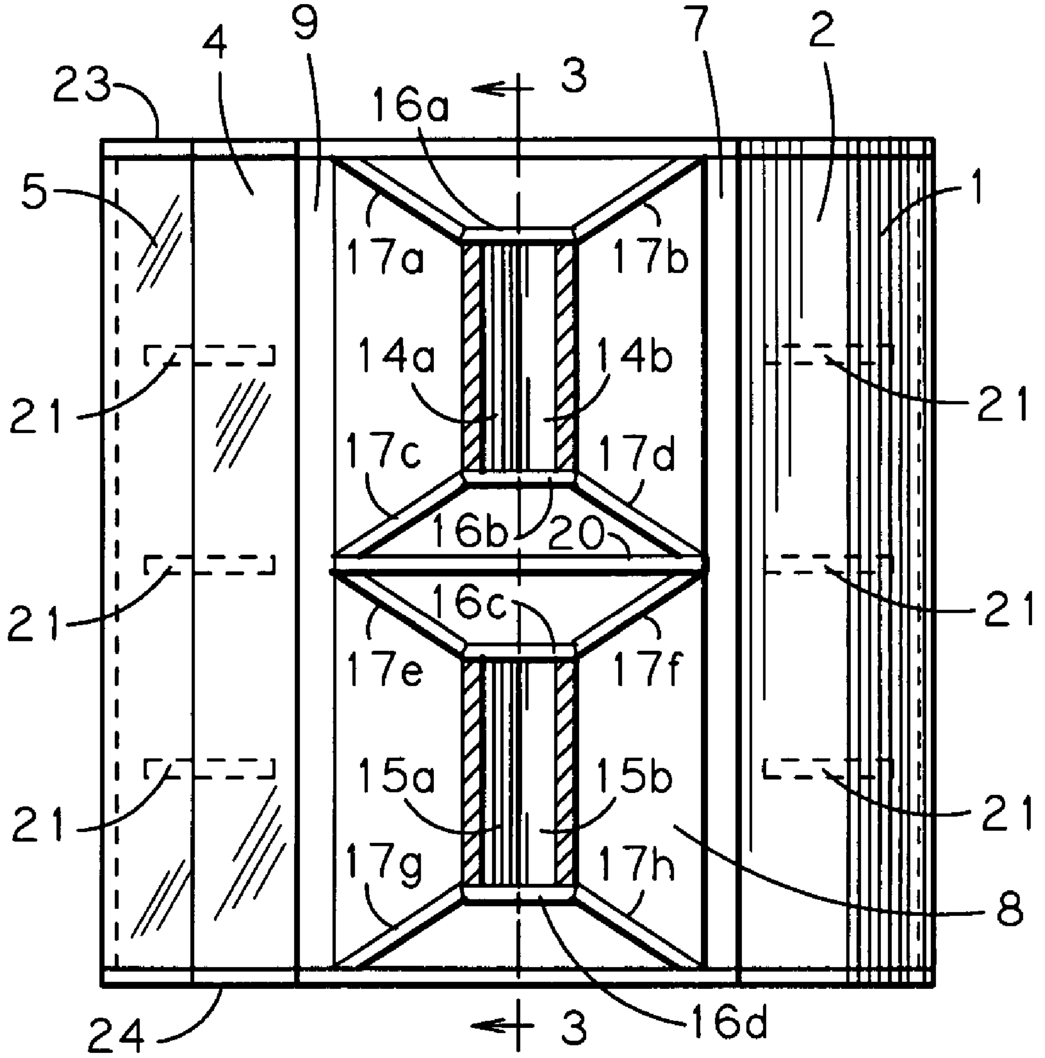
FIG. 5 is a rear elevation view with the back panel remove to show the throat sections.

Exponential expansion rates are used exclusively. The initial throat expansion rate is approximately 60 Hz or an exponential area doubling length of 12 inches, and the terminal exit channel flare rate is 38 Hz or an area doubling length of 19.6 inches. The throat horn pathway is best seen in FIGS. 1 and 5. The preferred embodiment throat opening 11 area is approximately 80 square inches per 15-inch diameter driver 13. The preferred embodiment throat opening 11 cross-sectional area is approximately 13 by 6 inches, the longer of the dimensions being relatively fixed by the diameter of the driver employed, and is arranged vertically in the baffle board 8.

As seen in FIGS. 1 through 5, an enabling feature of the current invention is that the butterfly throat configuration comprised of the rear panel 3, the baffle board 8, the upper and lower splitting wedges 14, 15, the throat horizontal parts 16, the throat exponential baffle parts 17, and horizontal brace 20 can be modified during construction by widening or narrowing the depth of the channel formed by the baffle board 8 and the rear panel 3 in conjunction with the flare rate presented by the throat exponential baffle parts 17 as desired, providing an ability to match the acoustic impedance of the terminal horn section at the point of juncture. The throat channel depth is not limited (due to its position in the enclosure) in the same manner as in the cited prior art. In combination with a removable driver mounting board (or motor board) 12, the acoustic impedance experienced by the respective driver 13 can also be manipulated as needed. It can also be noted that the lateral length of the throat section/baffle board assembly would have a direct effect on the lowest Fc obtainable for the throat section, the limiting consideration being one of overall footprint size. This aspect of the design allows for relatively easy scaling to a specific lower Fc (and longer flare rate) value, such as might be desirable if the use of 18-inch drivers are to be employed. Present in all embodiments, the top 23 and bottom 24 panels are subject to any changes that would effect the footprint.

Figure 2:
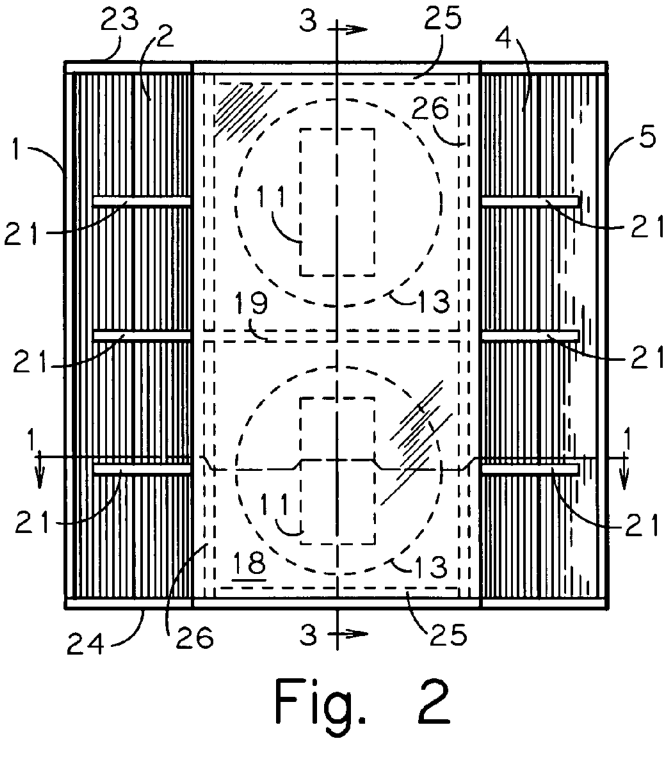
FIG. 2 is a front elevation view.

Referring to FIG. 1, the preferred embodiment of the invention is shown in cross-section as derived from line 1-1 of FIG. 2. The view of FIG. 1 does not include the horizontal channel braces 19, 20, 21, 22 for clarity. The horizontal channel braces 19, 20, 21, 22 are shown separately in FIG. 4, which is derived from line 4-4 of FIG. 3, where the lower driver is omitted from FIG. 4 for clarity.

Figure 3:
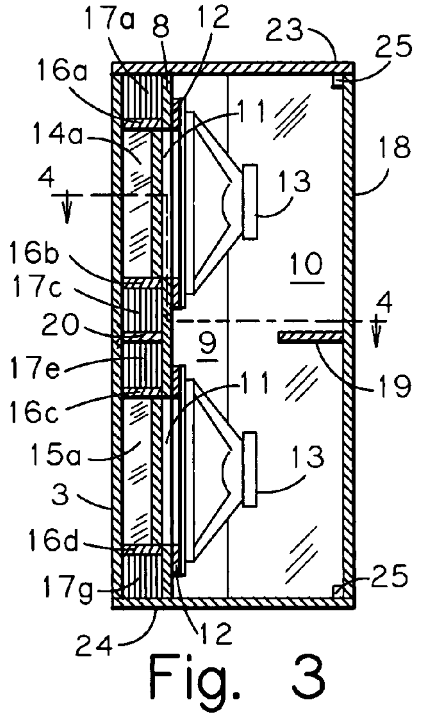
FIG. 3 is a sectional view from line 3-3 of FIGS. 1,2 and 5.

The throat channel splitting wedges comprised of parts 14*a*, 14*b* forming the upper wedge, and parts 15*a*, 15*b* forming the lower wedge as best seen in FIGS. 1, 3, and 5 bifurcate the propagated waveform traveling rearward from the throat opening 11 into equal vertical halves, and turn each half of the propagated waveform 90 degrees from the center in opposite directions. The splitting wedges formed by parts 14, 15 are hard-surface full-channel waveform reflectors arranged with a 45 degree front-facing surface angle. The use of full-channel reflectors is desirable due to the bandwidth capabilities of the invention.

The throat exponential baffle parts 17 where 17*a* through 17*d* are the upper throat section exponential baffle parts, and 17*e* through 17*h* constitute the lower throat section exponential baffle parts, are arranged between the rear panel 3 and the baffle board 8 to expand the horn channel vertically from the center of the respective throat opening 11 and to direct the sound waves horizontally away from the throat opening 11. The horizontal throat parts 16, where 16*a*, 16*b* are the upper throat section horizontal baffles, and parts 16*c*, 16*d* constitute the lower throat section horizontal baffles allow the splitting wedges 14, 15 to be constructed using two planar pieces each rather than being made from solid pieces. The preferred embodiment includes horizontal brace 20 which acts as a structural brace to reduce panel vibration and as an attachment substrate and is not present in the half-height embodiments. In the drawings the baffle board 8 is not as wide as the rear panel 3. This feature facilitates the corner-adaptation of the horn channels allowing the apparatus to better exploit a corner position and produce an optimal response.

The horn terminal section outer wall features two angled intermediate panels 2, 4 which are arranged in a 45 degree angle to correspond to the vertical dihedral formed by an environment corner. The corner-angled intermediate outer panels 2, 4, while providing an outer horn channel boundary, also serve as reflectors and are sized to provide a full-channel reflection as defined by the throat channel depth. The sound wave path is shown by dotted line 27 as seen in FIG. 1.

The interior angled corners on the rearward corners of the back chamber comprised of parts 7, 9 are specifically angled to cooperate with the intermediate outside angled panels 2, 4 to form a short portion of the terminal horn section, of which the specific angles and distances are determined by the flare rate of the terminal horn section. The horn terminal section is further comprised of the outer side panels 1, 2, 4, 5 and the inner sides formed by the back chamber wall panels 6, 7, 9, 10 as well as the top 23 and bottom 24 panels, producing fully-enclosed horn channels. It should be noted that the short intermediate horn section defined by parts 2, 4, 7, 9 can also be optionally configured to control the impedance by increasing or decreasing the channel width defined by the distance between the baffle board 8 and the rear panel 3, and/or flare rate of the throat section defined by the throat baffle parts 16, 17 as needed to properly match the acoustic impedance optimal for the terminal horn section. In the drawings, the flare rate shown in the intermediate section is the same flare rate as the terminal flare rate and may be regarded in this disclosure as the terminal horn section. The interior angled corners formed by parts 7, 9 of the back chamber are considered beneficial to the overall response in that the terminal pathway is made slightly longer, expansion consistency is enhanced, and further allows a certain amount of convenience in the resulting back chamber shape. The outside wall corner-angled parts 2, 4 should be considered to constitute a criticality to the optimum performance capability of the device as they directly effect the placement of the device in a corner.

Figure 10:
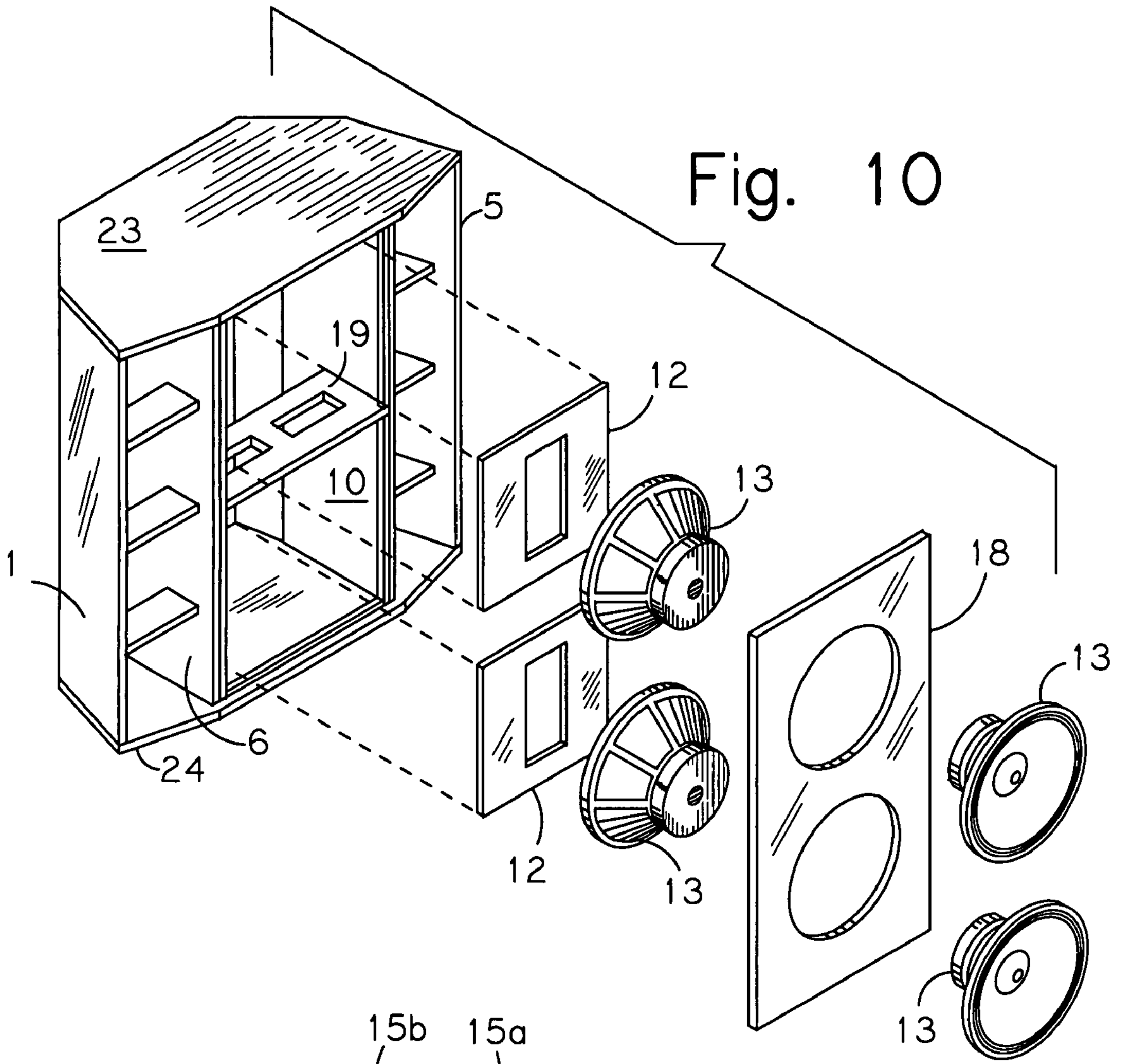
FIG. 10 is an exploded perspective view showing an optional push-pull driver configuration.
Figure 11:
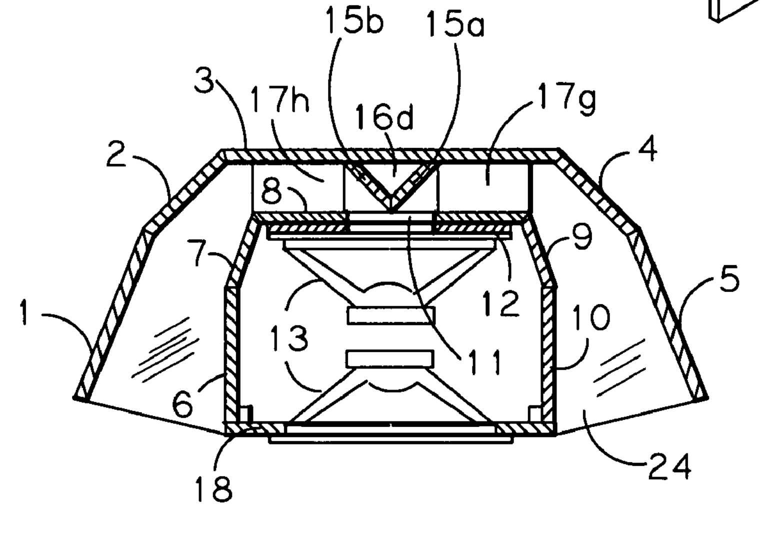
FIG. 11 is a sectional view consistent with the view of FIG. 1 showing the optional push-pull driver configuration shown in FIG. 10.
Figure 12:
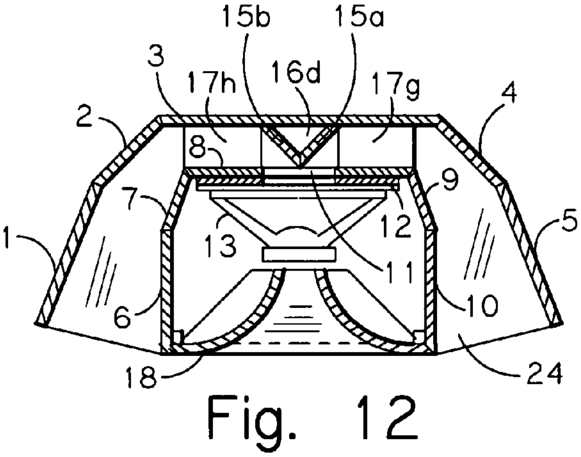
FIG. 12 is a sectional view consistent with the view of FIG. 1 showing an optional compound-horn configuration.
Figure 13:
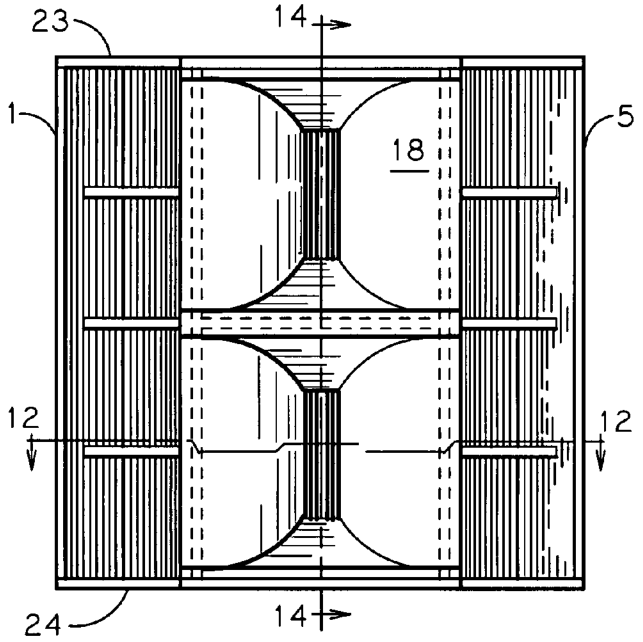
FIG. 13 is a front elevation view showing the optional compound horn configuration as shown in FIG. 12.
Figure 14:
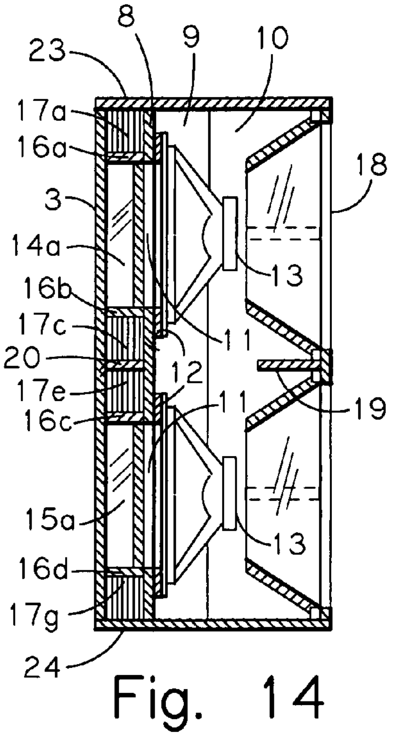
FIG. 14 is a sectional view from line 14-14 of FIG. 13 showing the optional compound horn configuration as shown in FIGS. 12 and 13.

The contiguous space contained within the back chamber formed by parts 6, 7, 8, 9, 10 allows for various configurations to be accomplished as shown in FIGS. 10 through 14. The possible configurations are achieved by the use of interchangeable drivers 13 and a removable front panel 18. FIGS. 10 and 11 show an alternative 4-driver push-pull configuration which is deemed impractical in the cited prior art device. Various front panel 18 modifications may include a fixed horn array making the apparatus a compound horn as shown in FIGS. 12 though 14, or any other combination of elements used to alter or enhance the output of the enclosure, such as phase-inverting mechanisms, alternative drivers, and the like. It can be seen that the benefit of back chamber parallel side walls 6, 10 provides a means by which the available back chamber volume is relatively maximized within the constraint of footprint size, and enhances the option of employing alternative driver configurations when also incorporating a removable front panel. It also presents an effective option as a "build-in" type of enclosure without modification. The removable front panel 18 is attached to horizontal attachment parts 25, vertical attachment parts 26, and the center horizontal brace 19 when present.

The contiguous back chamber space could alternatively be accessed from the top and bottom of the enclosure, allowing for a permanently fixed front panel 18 to be employed as desired. The tradeoff, naturally, is a reduction of utility. The previously cited prior art device did not easily present this option.

Figure 15:
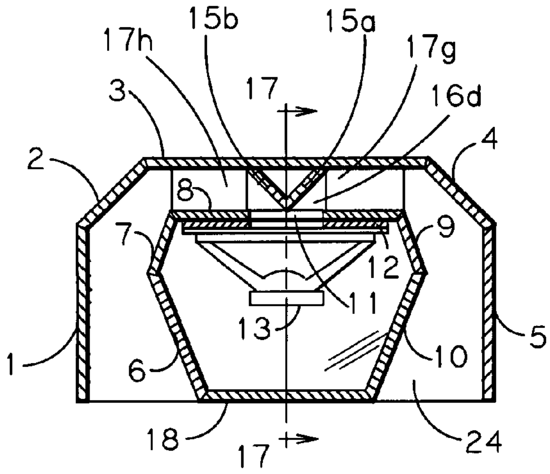
FIG. 15 is sectional view from line 15-15 of FIG. 16 showing an alternative front-loaded embodiment of reduced width.
Figure 16:
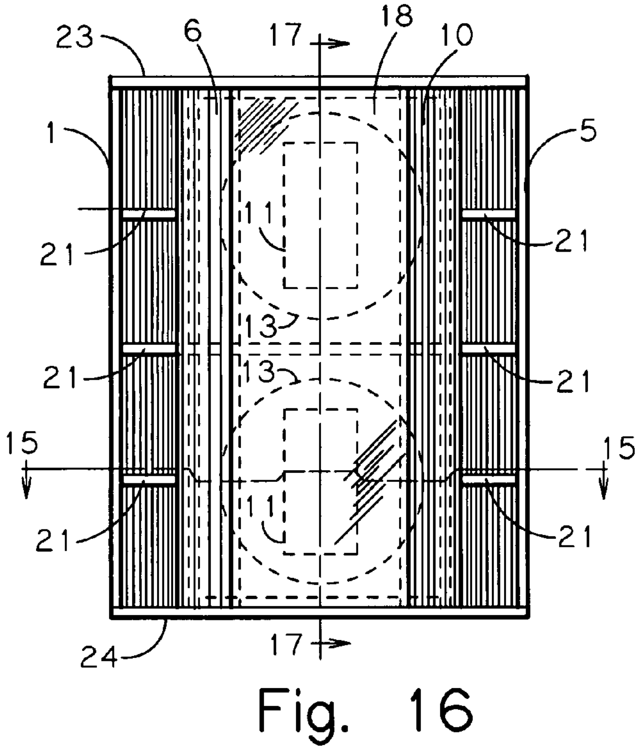
FIG. 16 is a front elevation view of the alternative front-loaded embodiment shown in FIG. 15.
Figure 17:
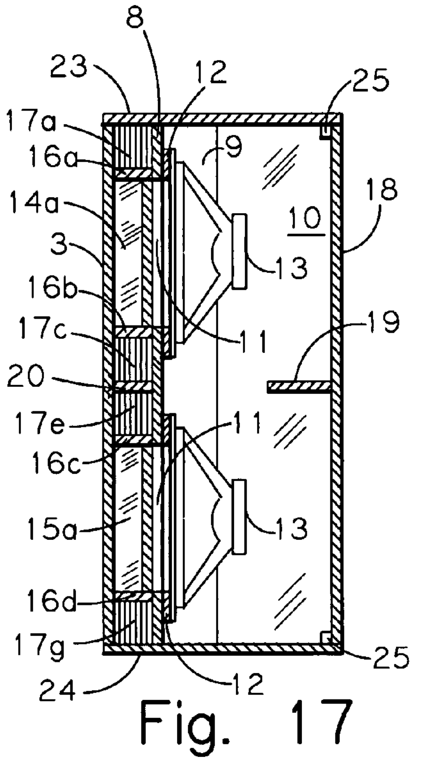
FIG. 17 is a sectional view from line 17-17 of FIGS. 15 and 16 of the alternative front-loaded embodiment.

The alternative front-loaded embodiment of reduced width shown in FIGS. 15 through 17 which disclose a natural adaptation of the current invention. Compared to the preferred embodiment, the reduced footprint of the alternative embodiment further increases portability, but with an expected reduction of utility. It is conceivable that the alternative embodiment would have access from the top and bottom of the enclosure rather than a removable front panel. It can be seen that the alternative embodiment would occasion some degree of desirability by its relatively compact dimensions. The terminal section outer exit channels as defined by parts 1, 5 and the back chamber side panels 6, 10 have been adjusted with an inward angle, compared to the preferred embodiment, achieving a more compact footprint. The alternative apparatus as shown remains optimized for corner operation, however, it could be further enhanced by the inclusion of external side-mounted foldable wing panels to prevent rearward diffraction when extended. In the case where the front panel 18 is permanently fixed, such as in the alternative embodiment of reduced width seen in FIGS. 15 though 17, and depending on the joinery used in construction, the vertical attachment parts 26 (and possibly horizontal attachment parts 25) are not typically present. The alternative embodiment of reduced width would seem to be particularly desirable for stage or theatre use, especially in half-height form.

It will be understood by those experienced in the art that the overall Fc of the terminal horn section tends to dictate the size of the enclosure, especially the relatively fixed requirement of mouth size and operational placement; therefore, the cabinets shown may be made larger or smaller than the preferred embodiment depending on the target Fc of the alternative application, with the corresponding throat channels altered appropriately, and alternative drivers may be substituted to suit a particular need.

It should also be realized that the alternative-use configurations, especially in the rear-loaded direct radiator embodiments, the front panel 18 could easily accept multiple drivers or combinations of drivers which are not shown in the drawings. The possible alternative configurations are therefore many and should not be limited to only that which is defined in the drawings.

Whereas this disclosure depicts one specific type of manufacture, it should not be limited to materials and processes that utilize only straight planar elements, such as plywood and the like. It should also be noted that while straight lines have been used for describing the various horn channels and reflectors, an alternative and perhaps better embodiment could utilize curved or concave elements which would promote an even rotational angle or approximate a true exponential curve more closely.

While in accordance with the provisions of the Patent Statutes, the preferred forms and embodiments have been illustrated and described, it will become apparent to those skilled in the art that various changes and modifications may be made without deviating from the inventive concepts set forth above.

I claim:

1. In a horn type loudspeaker for operation in a low frequency range, a cabinet comprised of a plurality of panels in sealed engagement, being substantially vertical in proportion, arranged in a vertically and horizontally symmetrical layout, wherein equal division along the horizontal plane would result in two essentially equal cabinets, said cabinet further comprising:

a back chamber assembly, a throat assembly, and terminal channel assembly, said back chamber assembly comprising an enclosed volume of air of a substantially rectangular shape, centrally and axially located, housing at least one driver, with at least one rear-facing throat opening located axially therein, the forward-most panel being removable, said throat assembly comprising a vertically bifurcated horizontal channel, each channel side being directed oppositely from said at least one throat opening, and including vertically arranged baffles forming the flaring portions therein, said channels comprising the throat section, said throat section being partially completed by a rearwardly-located panel, arranged perpendicular to the horizontal central axis, said terminal channel assembly comprising two vertically-proportioned exit channels, said exit channel terminus mouth size appropriate for its planned position, said exit channels comprising a single fold in the horizontal plane, and exhausting equally from both sides of said back chamber, whereby the sides of said back chamber further complete said exit channels, said throat section and said exit channel section comprised of at least two different flare rates, the terminal section being the longest of the two, and having the lower flare rate, the first section being the shortest in length and having the higher flare rate, full-channel hard-surface reflectors at the juncture of said throat and said terminal sections, said terminal section reflectors each comprising an outside channel wall portion, to control the direction of waveforms to and from said sections, a top panel, and a bottom panel, completing said back chamber assembly, said throat assembly and said terminal exit channels.

2. A folded horn enclosure optimized for operation in stacked pairs, comprising:

an assembly of vertical panels arranged to fold an expanding column of air horizontally around each side of a central back chamber consisting of vertical panels, said back chamber being adapted with a removable front panel, said folds occurring in the same plane, and said air column exhausting in a mostly-forward direction, said assembly partially forming enclosed horn sections having different flare rates, said enclosed sections being partially defined by said air chamber rear and side walls, said air column being horizontally bifurcated at a rearward throat opening in said back chamber, said back chamber further housing at least one sound producing driver, said throat opening being arranged to transmit sound waves to said horn sections therebeyond, said horn sections having a terminal section comprised of a predominately vertical proportion, said enclosure being adapted rearwardly for corner placement, said corner adaptation being part of said horn channels, said terminal section defining a horn mouth being less than one-half the optimum size for corner operation as defined by said flare rate thereof, and a top and bottom panel arranged in sealed engagement with said assembly and said air chamber, completing said horn sections and said air chamber therewith.

3. In a folded horn loudspeaker for corner operation, two butterfly throat horn sections arranged inline one on top of the other, each having a horizontal pathway, being rearwardly arranged on a columnar back chamber, said chamber having two throat openings to transmit sound waves into each said throat section, and at least one sound producing driver being housed therein, a further section of horn having a lower flare rate, expanding horizontally, being enclosed at the outward sides, arranged to fold said sound waves from said throat sections around said air chamber sides, exhausting forwardly and forming a mouth, said mouth having a predominately vertical proportion therein, means for reflecting sound waves from said throat sections and redirecting said waves, and completing means for said throat sections, said further section and said air back chamber.

4. In a folded horn loudspeaker as set forth in claim 3, wherein said reflecting means includes full-channel hard-surface reflectors.

5. In a folded horn loudspeaker as set forth in claim 4, wherein said reflectors being partially defined by two rearwardly located outer side panels of said further section being arranged to cooperate with a corner.

6. In a folded horn loudspeaker as set forth in claim 3, wherein said mouth is optimized for corner operation.

7. In a folded horn loudspeaker as set forth in claim 3, wherein said completing means includes a top and bottom panel.

8. In a folded horn loudspeaker as set forth in claim 7, wherein said completing means further includes a removable front panel on said back chamber.

9. In a folded horn loudspeaker as set forth in claim 7, wherein said completing means includes a removable access panel on both said top and bottom panels.

10. In a folded horn loudspeaker as set forth in claim 9, wherein said completing means further includes a front panel on said back chamber.

* * * * *